United States Patent [19]

Kornrumpf

[11] Patent Number: 4,916,349

[45] Date of Patent: Apr. 10, 1990

[54] LATCHING PIEZOELECTRIC RELAY

[75] Inventor: William P. Kornrumpf, Albany, N.Y.

[73] Assignee: Pacific Bell, San Francisco, Calif.

[21] Appl. No.: 192,200

[22] Filed: May 10, 1988

[51] Int. Cl.[4] ............................................. H01L 41/08
[52] U.S. Cl. .................... 310/332; 310/358; 310/359
[58] Field of Search ............... 310/330–332, 310/357–359, 366

[56] References Cited

U.S. PATENT DOCUMENTS

| | | | |
|---|---|---|---|
| 2,928,032 | 3/1960 | Daniel et al. | 310/359 X |
| 3,868,553 | 2/1975 | Adler | 310/358 X |
| 4,533,849 | 8/1985 | Schnell | 310/359 X |
| 4,553,061 | 11/1985 | Germano | 310/332 |
| 4,625,137 | 11/1986 | Tomono | 310/332 X |
| 4,654,553 | 3/1987 | Sato et al. | 310/332 X |
| 4,670,682 | 6/1987 | Harnden, Jr. et al. | 310/332 |
| 4,684,337 | 8/1987 | Bauer | 310/357 X |

*Primary Examiner*—Mark O. Budd
*Attorney, Agent, or Firm*—McCubbrey, Bartels, Meyer & Ward

[57] ABSTRACT

An improved piezoelectric relay based on a bimorph actuator is described. The relay maintains its state in the absence of power thereto. The relay operates by changing the residual polarization of the piezoelectric strips used in the bimorph actuator.

4 Claims, 4 Drawing Sheets

LATCHING PIEZOELECTRIC RELAY

The present invention relates to piezoelectric relays and more particularly to latching piezoelectric relays.

Relays having an actuator or bender consisting of a piezoelectric bimorph element are well known to the prior art. Such relays typically employ a finger-like bimorph actuator which is constructed from two thin rectangular sheets of piezoelectric material bonded to the opposite sides of a center shim which is typically a brass sheet. One end of the bimorph actuator is typically immobilized in a clamp while the other end, which carries a relay contact, is free to move in response to electrical fields generated in the bimorph by maintaining predetermined potential differences between electrodes which are included in the bimorph actuator. The face of each sheet which is opposite that bonded to the center shim is typically plated with a conductive material to form an electrode. One such electrode is formed on the top surface of the bimorph, and a second such electrode is formed on the bottom surface of the bimorph. The electric fields in question are generated by the application of a potential between the center shim which forms a third electrode and these surface electrodes.

Relays of this type must be continually powered to maintain the state of the relay. To be useful, the relay must have at least two states, one in which the contacts are closed and one in which the contacts are separated. At least one of these states requires that power be applied to the bimorph element. In a typical prior art piezoelectric relay, the bimorph element has one of the contacts in question on the end thereof. When electric fields are applied to be piezoelectric sheets which make up the bimorph element, this contact is moved so as to contact the second contact which is typically mounted on a fixed surface and positioned so as to engage the contact on the bimorph element when the bimorph element is deflected from a resting position. When the electric fields are removed from the bimorph element, the bimorph element returns to a neutral position and the contacts are separated. Hence, to maintain the contacts in the closed position, power must be continually applied to the bimorph element or some form of mechanical latching apparatus must be included in the relay to prevent the contacts from separating when power is removed from the bimorph element.

Both of these methods of maintaining the contacts in the closed position are unsatisfactory. Providing a source of uninterrupted power is often not possible at an acceptable cost. In addition, maintaining power on the bimorph element increases the cost of operation of the relay. Finally, satisfactory mechanical latches are expensive to construct and decrease the reliability and lifetime of the relay.

Broadly, it is an object of the present invention to provide an improved piezoelectric relay.

It is a further object of the present invention to provide a piezoelectric relay which does not require that power be maintained to the relay or that mechanical latch elements be employed in order to maintain the state thereof.

These and other objects of the present invention will become apparent to those of ordinary skill in the relay arts from the following detailed description of the invention and the accompanying drawings.

SUMMARY OF THE INVENTION

The present invention comprises a bimorph actuated relay constructed from a cantilever mounted piezoelectric bimorph element having first and second planar piezoelectric strips. The position of the free end of said bimorph element is determined by altering the the residual polarization of at least one of the first or second planar piezoelectric strips in response to predetermined control signals. In the preferred embodiment, the residual polarization is altered by applying electrical signals to electrodes which sandwich each of the piezoelectric strips. To depolarize a piezoelectric strip, an AC signal is applied across the strip to create an electric field in the strip which alternates in direction. To polarize a piezoelectric strip, a pulsating signal is applied across the strip which creates a pulsating electric field which always points in the same direction. Alternatively, a piezoelectric strip may be polarized by applying a constant voltage across the strip.

DETAILED DESCRIPTION OF THE INVENTION

Figure 1:
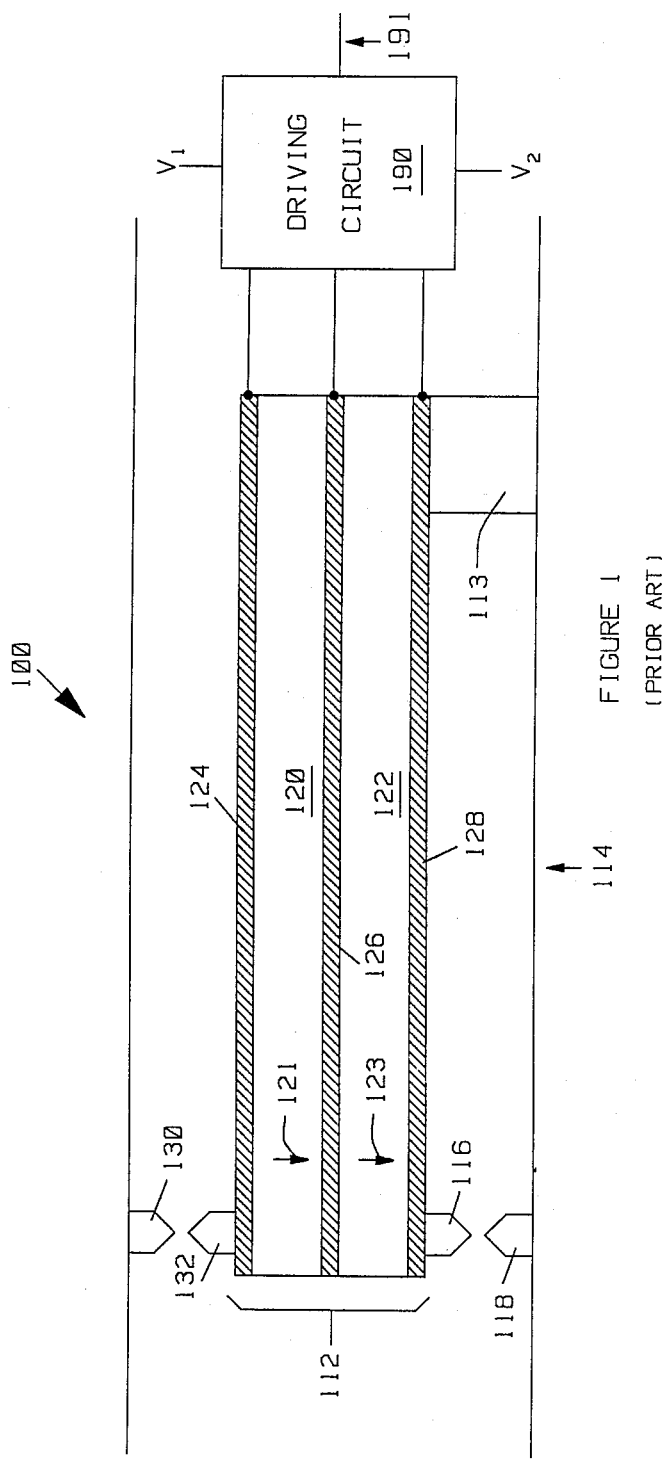
FIG. 1 is a cross-sectional view of a prior art piezoelectric relay.

The advantages of the present invention will become more apparent after a discussion of a typical prior art piezoelectric bimorph relay element 112 shown in FIG. 1.

FIG. 1 is a cross-sectional view of a piezoelectric relay 100 constructed from a bimorph element 112 which is actuated by switching voltages applied to the top and bottom electrodes thereof. The bimorph element 112 is mounted in a cantilever manner over a mounting surface 114 by attaching one end to a raised portion 113 on the mounting surface 114. The free end of bimorph element 112 includes a first electrical contact 116 which is electrically isolated from bimorph element 112. The contact 116 is brought into contact with a second electrical contact 118 when the free bimorph end on which the first electrical contact 116 is mounted moves toward the surface 114.

The bimorph element 112 typically consists of two planar strips of piezoelectric material 120 and 122 which are bonded to three planar electrodes 124, 126 and 128. The top electrode 124 and the bottom electrode 128 are typically constructed by electroless plating of a conducting material such as nickel on the corresponding piezoelectric strips although other methods of bonding the electrodes to the surface of the piezoelectric strips will be apparent to those skilled in the art.

The center electrode 126 is typically a brass shim connected to plated electrodes on the surfaces of the piezoelectric strips which are adjacent to said shim. For clarity, these plated electrodes are omitted from FIG. 1. Center electrode 126 may also be constructed by depositing a metallic layer between two sheets of piezoelectric ceramic material such as lead zirconate titanate prior to firing the ceramic material.

Each of the strips of piezoelectric material 120 and 122 is polarized such that the application of an electrical field across the strip will result in a change in the length of the strip. If a potential is applied across only one of the strips, bimorph element 112 will bend causing the free end thereof to move in a direction which is perpendicular to the surface of the piezoelectric strips. The direction of motion will be toward the strip whose length decreased.

This polarization is typically accomplished by applying voltages between the two electrodes on each side of the piezoelectric sheet while cooling the piezoelectric sheet in question from a temperature above the Curie point of the piezoelectric material to a temperature below said Curie point. Alternatively, the polarization of some piezoelectric materials may be carried out at room temperature by applying significantly larger potentials across the piezoelectric strips then those needed if the materials are heated above their Curie point. The polarizing electric fields cause micro domains in the piezoelectric material to become aligned.

The length of each piezoelectric strip depends on the degree of polarization of that strip. If the unpolarized length of the piezoelectric strip is $L_0$, then after the above described polarization, the strip will have a new length, $L_r$. In general, $L_r$ will be less than the $L_0$ but greater than the minimum length for the piezoelectric strip, since the degree of polarization which remains after the polarizing electric fields are removed from the piezoelectric strip is less than the maximum degree of polarization for the piezoelectric strip. To obtain the maximum degree of polarization, an electric field must be maintained across the piezoelectric strip.

After polarization, the length of each piezoelectric strip may be changed by applying an electric field to that strip which either increases or decreases the polarization of the strip. The direction of the applied electrical field relative to the direction of polarization determines whether the length of the strip will increase or decrease. If the electric field produced by the potentials on the electrodes is in the same direction as the electric field used to polarize the piezoelectric strip, the piezoelectric strip will decrease in length because it will become further polarized. However, when the electric field is removed, the length of the piezoelectric strip will return to $L_r$.

If the direction of the applied electric field is opposite to that used to polarize the piezoelectric strip, the piezoelectric strip will become partially depolarized. This will cause the piezoelectric strip to increase in length. Provided the applied electric field is small, the piezoelectric strip will return to its initial polarization state and length, $L_r$ when the electric field is removed. If, however, the electric field is large, the length of the piezoelectric strip when the field is removed will greater than $L_r$, because the piezoelectric strip will have become partially depolarized. However, it is important to note, that the length of the piezoelectric strip will not return to $L_0$. If the applied electric field is too large, the piezoelectric strip will merely become polarized in the opposite direction.

Referring to bimorph element 112, the polarization of the piezoelectric material in strip 120 is in the same direction as that of the material in strip 122 as indicated by the arrows 121 and 123 which point in the direction of the electric fields used to polarize the piezoelectric strips in question. The electric fields used to actuate the relay are typically generated by the application of an electrical potential between the electrodes 124 and 126 simultaneously with the application of the opposite potential between the electrodes 126 and 128. This potential causes one of the strips to shorten and the other to elongate; hence, this mode of driving the bimorph will be referred to as the "push-pull" driving mode. As a result of the application of these potentials, the bimorph will either bend toward the surface 114 or away from said surface depending on the direction the electrical fields generated. Typically, one direction is used to close the relay contacts, the other is used to move the contacts away from each other. In principle, this second motion can be used to cause a second set of contacts 130 and 132 to close thus implementing a single pole double throw relay.

A driving circuit for switching the voltages is indicated at 190 in FIG. 1. Such circuitry is conventional in the electronic arts and hence has not been shown in detail. Driving circuit 190 connects each electrode connected thereto to one of two potentials $V_1$ or $V_2$. The choice of which potential is connected to each electrode is determined by a control signal on an input line 191.

In prior art piezoelectric relays, every attempt is made to avoid permanent depolarization of the piezoelectric strips. Depolarization of one or both of the piezoelectric strips leads to a phenomenon which is often referred to as "sag". When no electric fields are applied to the bimorph element, the bimorph element is said to be in its neutral position. In the neutral position, both of the piezoelectric strips are equally polarized, having lengths equal to $L_r$. If one of the piezoelectric strips becomes partially depolarized, its length will increase. Hence, the position of the bimorph element in the neutral position will change. As a result, the contacts may be brought together when they are not supposed to contact each other or the load rating of the relay altered. To avoid sag, prior art relays have limited the electric fields applied to the strip which is driven in the "push" direction, i.e., the anti-polarization direction, or even refrained from driving either strip in this direction. Both of these strategies impose design constraints on the relays which increase the amount of piezoelectric material needed to provide a relay with a given voltage and current rating.

One problem with prior art piezoelectric relays is that such relays will not maintain contact between contacts 116 and 118 if the potentials are removed from electrodes 124, 126, and 128. As noted above, when power is removed from bimorph element 112 it returns to the neutral position in which the relay contacts 116 and 118 are separated. Hence, relay 100 requires that power be maintained on electrodes 124, 126, and 128 at all times. This is not always practical. In addition, the operating cost of relay 100 is increased by the need to supply power to driving circuit 190 at all times.

In contrast to prior art designs, the present invention utilizes the depolarization of one of the piezoelectric strips to provide a relay which maintains its state when power is removed therefrom. For the purposes of this discussion, the degree of polarization of the piezoelectric strips which remains when power is removed therefrom will be referred to as the residual polarization of these strips. In prior art piezoelectric relays, the degree of residual polarization is not altered during the operation of the relay. In the present invention, the residual polarization is altered each time the state of the relay is changed.

Figure 2:
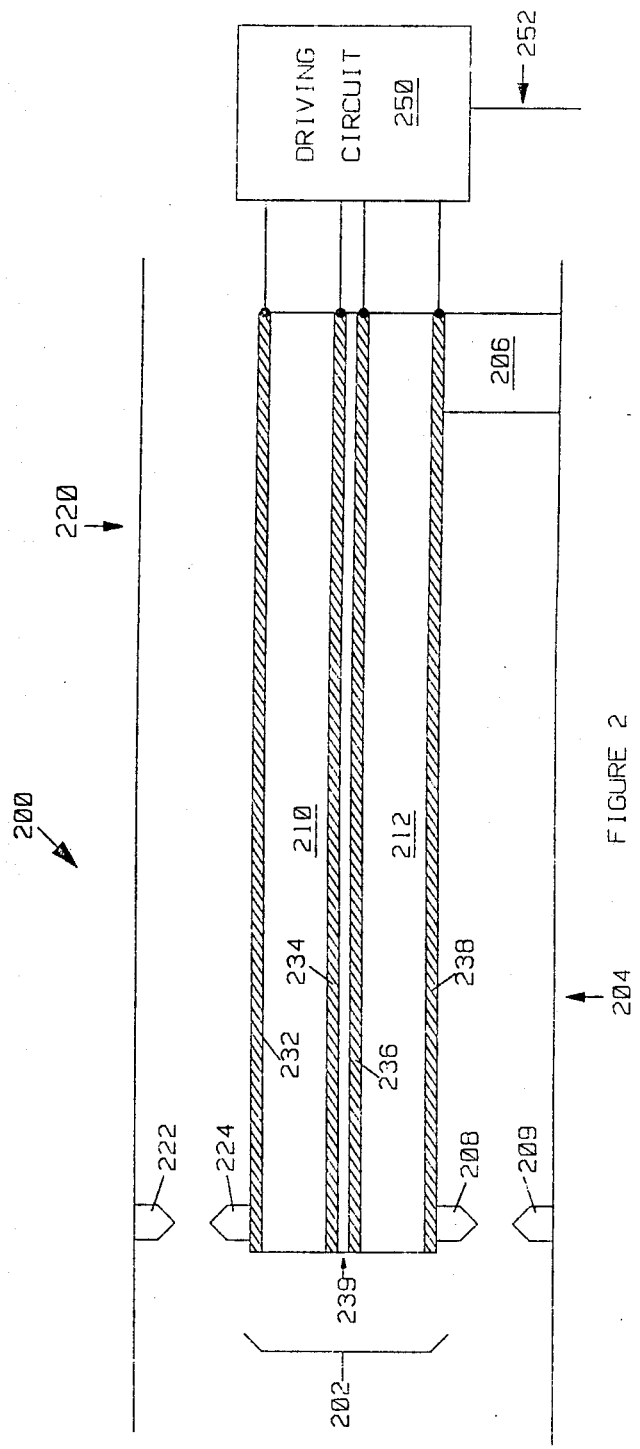
FIG. 2 is a cross-sectional view of one embodiment of a piezoelectric relay according to the present invention.

One embodiment of a relay according to the present invention is shown at 200 in FIG. 2. Relay 200 includes a bimorph element 202 mounted in a cantilever manner over a surface 204 by spacing bimorph element 202 from surface 204 using a spacer 206. A contact 208 is affixed to the free end of bimorph element 202. Contact 208 is caused to touch a second contact 209 mounted on surface 204 when bimorph element 202 bends toward surface 204.

Bimorph element 202 is constructed from two planar strips of piezoelectric material shown at 210 and 212. When both of these piezoelectric strips are polarized, bimorph element 202 is in the neutral position which is the position shown in FIG. 2. If one of these piezoelectric strips were to become depolarized, the length of that strip would increase which, in turn, would cause bimorph element 202 to bend in a direction away from the depolarized piezoelectric strip. Hence, bimorph element 202 may be caused to bend toward surface 204 by depolarizing piezoelectric strip 210 while maintaining piezoelectric strip 212 in the polarized state. And, bimorph element 202 may be caused to bend toward surface 220 by depolarizing piezoelectric strip 212 while maintaining piezoelectric strip 210 in the polarized state. This motion may be used to further separate contacts 208 and 209 and/or to make contact between a second set of contacts 222 and 224.

The residual polarization of the piezoelectric strips of the present invention are preferably altered by applying appropriate voltages to planar electrodes bonded to the surfaces of the piezoelectric strips. For the purpose of this discussion, each of the piezoelectric strips shown in FIG. 2 has two planar electrodes bonded to the surfaces thereof. Piezoelectric strip 210 is sandwiched between planar electrodes 232 and 234. Piezoelectric strip 212 is sandwiched between planar electrodes 236 and 238.

To polarize a given piezoelectric strip, a constant electric field is generated in said piezoelectric strip by applying a constant potential difference between the electrodes which sandwich said strip. The potential difference must be above a minimum value which depends on the piezoelectric material from which the piezoelectric strip is constructed and the thickness of that strip. For example, if the piezoelectric strip is constructed from lead zirconate titanate, the potential difference must be sufficient to create an electric field of at least $1.1 \times 10^4$ volts/cm.

To depolarize a piezoelectric strip, an alternating electric field is generated in said piezoelectric strip by applying an AC voltage between the electrodes which sandwich the piezoelectric strip in question. The magnitude and frequency of the AC voltage needed to depolarize the piezoelectric strip will depend on the piezoelectric material and its thickness. The frequency of the AC voltage must be sufficiently high to prevent all of the micro domains in the piezoelectric strip from becoming aligned during a single cycle of the AC voltage. At the same time, the frequency must be sufficiently low to allow at least some of the domains to become aligned with the electric field during each cycle of the AC voltage. For example, a lead zirconate titanate piezoelectric strip having a thickness of 0.007 inches may be depolarized by applying an AC voltage of 300 volts at a frequency of 1 Hz.

Hence, to set relay 200 such that contacts 208 and 209 are touching, piezoelectric strip 210 is connected to a power source which provides an AC voltage across said strip, and piezoelectric strip 212 is connected to a power source which provides a constant potential across said strip. These potentials are applied for a period of time which is sufficient to cause piezoelectric strip 210 to become depolarized and piezoelectric strip 212 to become polarized. The potentials may then be removed, and bimorph element 202 will remain bent such that contacts 208 and 209 are touching, since the residual polarizations of the piezoelectric strips will have been changed. Similarly, contacts 208 and 209 may be separated by applying a polarizing potential to strip 210 either with or without a depolarizing AC potential being applied to piezoelectric strip 212. If a depolarizing potential is not applied to piezoelectric strip 212, the final resting position of bimorph element 202 when the potentials are removed from the electrodes sandwiching the piezoelectric strips will be the neutral position. If a depolarizing potential is applied to piezoelectric strip 212, the final resting position will be such that contacts 222 and 224 are touching.

Although the operation of the present invention has been described in terms of a constant polarizing potential being used to polarize one of the piezoelectric strips, it will be apparent to those skilled in the piezoelectric arts that a piezoelectric strip may also be polarized by applying a pulsating potential across the piezoelectric strip in question. So long as the peak magnitude of the potential difference is sufficiently large and the average direction of the electric field generated in the piezoelectric strip by said pulsating potential difference is in the same direction, the piezoelectric strip will become at least partially polarized. It is preferred, however, that the direction of the electric field be always in the same direction since this results in more complete polarization.

Figure 3:
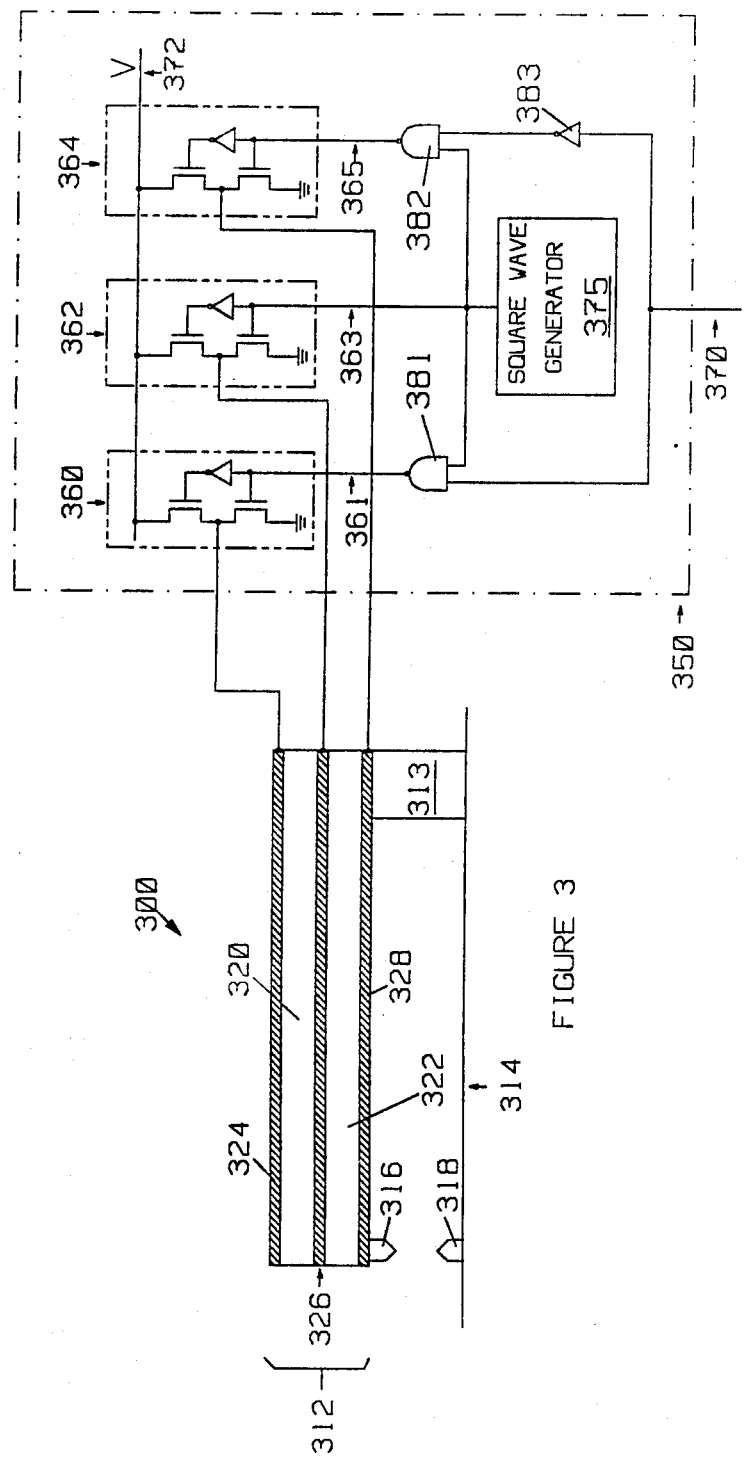
FIG. 3 is a cross-sectional view of the preferred embodiment of the present invention.

By using a pulsating electric field for polarizing the piezoelectric strips, a relay according to the present invention which has fewer electrodes than relay 200 shown in FIG. 2 may be constructed. Such a relay is shown in FIG. 3 at 300. Relay 300 is similar to relay 100 shown in FIG. 1 in that it is constructed from a bimorph element 312 which is mounted in a cantilever manner over a surface 314 by spacing bimorph element 312 from said surface with a spacing element 313. When the free end of bimorph element 312 moves toward surface 314, a connection is made between two electrical contacts 316 and 318.

Bimorph element 312 is constructed from two piezoelectric strips 320 and 322 which are sandwiched between three electrodes 324, 326, and 328. When the free end of bimorph element 312 moves toward surface 314 in response to the state of polarization of piezoelectric strips 320 and 322 being changed, electrical contact is made between two relay contacts 316 and 318.

A driving circuit for changing the residual polarizations of piezoelectric strips 320 and 322 is shown at 350. Driving circuit 350 may be used to generate an electric field having a direction which alternates in one of the piezoelectric strips while simultaneously generating a pulsating electric field having an electric field always in the same direction in the other of the piezoelectric strips.

Driving circuit 350 includes three half-bridge circuits 360, 362, and 364. Each half-bridge circuit is used to connect one of the electrodes shown in FIG. 3 to a potential selected from two potentials shown as ground and V in FIG. 3. The identity of the potential so selected is specified by a signal level on a control line connected to each half-bridge circuit. The control line for circuit 360 is shown at 361. The control line for circuit 362 is shown at 363, and the control line for circuit 364 is shown at 365. The transistors used to construct the half bridge circuits are preferably high voltage transistors since the voltages needed to change the polarizations of the piezoelectric strips may be as high as several hundreds of volts.

The voltages applied to control lines 361, 363, and 365 are determined by a control signal on line 370 and by a square wave generator 375. The output of the square wave generator is applied to control line 363. Either the complement of the output of square wave generator 375 or a constant potential $V_c$ is applied to control line 361 by NAND gate 381. The choice of which signal is applied to control line 361 is specified by control signal 370. Similarly, either the complement of the output of square wave generator 375 or a constant potential $V_c$ is applied to control line 365 by NAND gate 382. The choice of which signal is applied to control line 365 is specified by control signal 370. When $V_c$ is applied to control line 361, the complement of the output of square wave generator 375 is applied to control line 365 and vice versa.

Figure 4:
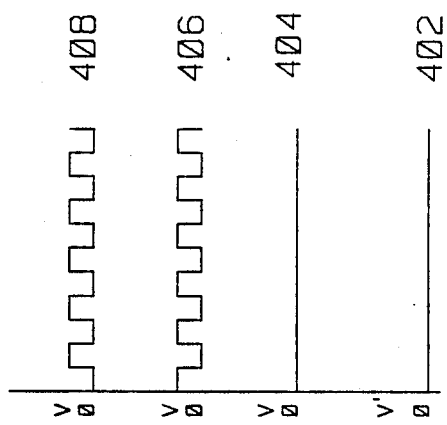
FIG. 4 is a graph of the potentials used to drive the relay shown in FIG. 3 in one direction.
Figure 5:
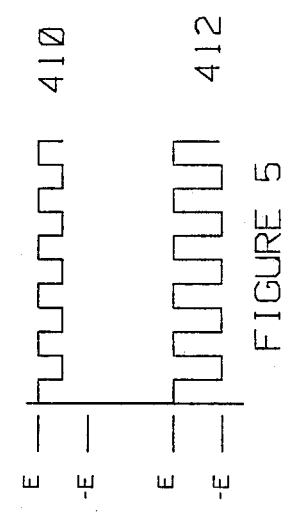
FIG. 5 is a graph of the electric fields generated in the piezoelectric strips of the relay shown in FIG. 3 when the potentials shown in FIG. 4 are applied thereto.

Consider the case in which bimorph element 312 is to be bent toward surface 314. To accomplish this, piezoelectric strip 320 must be depolarized and piezoelectric strip 322 must be polarized. Driving circuit 350 accomplishes this by placing a constant potential on electrode 328, a square wave on electrode 326, and the complement of said square wave on electrode 324. This potential pattern is illustrated in FIG. 4. The potentials on electrodes 328, 326, and 324 are shown at 404, 408, and 406, respectively. The potential on the control line 370 is shown at 402. The electric fields generated in piezoelectric strips 320 and 322 by the potentials on electrodes 328, 326, and 324 are shown in FIG. 5 at 412 and 410, respectively. The electric field strength, E, is proportional to the potential V on line 372 shown in FIG. 3.

Since the electric field generated in piezoelectric strip 320 alternates in direction, piezoelectric strip 320 will be depolarized, and its length will increase. The electric field generated in piezoelectric strip 322 does not change direction; hence piezoelectric strip 322 will become polarized and its length will be less than that of piezoelectric strip 320. As a result, bimorph element 312 will bend toward surface 314.

Once piezoelectric strips 320 and 322 are depolarized and polarized, respectively, power may be removed from the driving circuit and the state of relay 300 will remain unchanged. That is, contacts 316 and 318 will remain touching. Power may be removed from driving circuit 350 by disconnecting line 372 from the power source which maintains that line at V.

To separate contacts 316 and 318, the complement of the above control signal value is provided on line 370. This results in electrode 324 being held at the constant potential of V while electrodes 326 and 324 are subjected to a square wave and the complement thereof, respectively. As a result, piezoelectric strip 320 will become polarized, and piezoelectric strip 322 will become depolarized. Thus piezoelectric strip 320 will become shorter than piezoelectric strip 322, and bimorph element 312 will bend upward.

Figure 6:
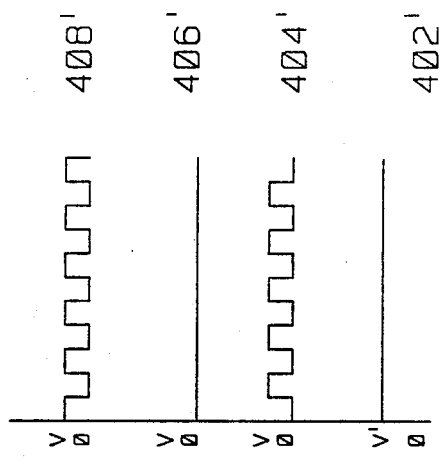
FIG. 6 is a graph of the potentials used to drive the relay shown in FIG. 3 in direction opposite to that shown in FIG. 4.
Figure 7:
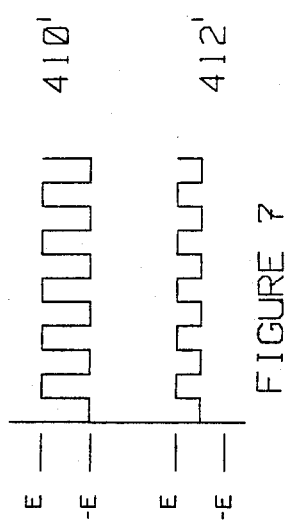
FIG. 7 is a graph of the electric fields generated in the piezoelectric strips of the relay shown in FIG. 3 when the potentials shown in FIG. 6 are applied thereto.

The potential patterns and resulting electric fields are shown in FIGS. 6 and 7, respectively. The potentials on electrodes 328, 326, and 324 are shown at 404', 408', and 406', respectively. The potential on the control line 370 is shown at 402'. The electric fields generated in piezoelectric strips 320 and 322 by the potentials on electrodes 328, 326, and 324 are shown in FIG. 7 at 412' and 410, respectively.

Once piezoelectric strips 320 and 322 are polarized and depolarized, respectively, power may be removed from the driving circuit and the state of relay 300 will remain unchanged. That is, contacts 316 and 318 will remain separated. As noted above, power may be removed from driving circuit 350 by disconnecting line 372 from the power source which maintains that line at V.

It will be apparent to those skilled in the art that the bimorph element of the present invention may be used as an actuator in other apparatuses than relays. The bimorph element can, in principle, be used for any purpose requiring a mechanical arm having two positions which are to be set by electrical control signals.

Accordingly, an improved piezoelectric actuator and relay have been described in which the state of the relay is maintained even in the absence of power being applied thereto. Modifications of the present invention will be apparent to those of ordinary skill in the relay arts; hence the scope of the present invention is to be limited only by the following claims.

What is claimed is:

1. A relay comprising:
   a cantilever mounted piezoelectric bimorph element having one end fixed and the other end thereof free, said bimorph element including first and second planar piezoelectric strips;
   first contact means coupled to the free end of said bimorph element, positioned so as to engage a second contact means when the free end of said bimorph element is displaced in a predetermined direction;
   a first set of electrodes comprising two planar electrodes sandwiching said first planar piezoelectric strip;
   a second set of electrodes comprising two planar electrodes sandwiching said second planar piezoelectric strip; and
   field means for altering the residual polarization of one of said first and second planar piezoelectric strips in response to predetermined control signals, said field means including means for applying first and second electrical signals to said first and second sets of planar electrodes, said first electrical signal being a DC signal causing one of said first and second piezoelectric strips to be substantially polarized and said second electrical signal being an AC signal causing the other of said first and second piezoelectric strips to be substantially depolarized.

2. A relay comprising:
   a cantilever mounted piezoelectric bimorph element having one end fixed and the other end thereof free, said bimorph element including first and second planar piezoelectric strips;

first contact means coupled to the free end of said bimorph element, positioned so as to engage a second contact means when the free end of said bimorph element is displaced in a predetermined direction;

first and second electrodes sandwiching said first piezoelectric strip, and said second electrode in combination with a third electrode sandwiching said second piezoelectric strip; and circuit means for altering the residual polarizations of said first and second piezoelectric strips in response to predetermined control signals, said circuit means including means for generating an alternating direction electric field in one of said first and second piezoelectric strips, said alternating electric field causing said one of said piezoelectric strips to become substantially depolarized, and a pulsating uni-directional electric field in the other of said first and second piezoelectric strips causing said other one of said piezoelectric strips to be substantially polarized.

3. In a relay comprising a cantilever mounted piezoelectric bimorph element having one end fixed and the other end thereof free, said bimorph element including first and second planar piezoelectric strips and a first contact means coupled to the free end of said bimorph element positioned so as to engage a second contact means when the free ed of said bimorph element is displaced in a predetermined direction by the application of an electric field to one of said piezoelectric strips; a method of altering the position of said free end of said bimorph element comprising the steps of:

(a) applying an AC electric field to one of said piezoelectric strips causing said one piezoelectric strip to become substantially depolarized; and (b) applying a DC electric field to the other of said piezoelectric strips causing said other piezoelectric strip to be substantially polarized.

4. The method of claim 3 wherein step (b) comprises applying a pulsating uni-directional electric field to the other of said piezoelectric strips causing said other piezoelectric strip to be substantially polarized.

* * * * *

UNITED STATES PATENT AND TRADEMARK OFFICE
CERTIFICATE OF CORRECTION

PATENT NO. : 4,916,349

DATED : April 10, 1990

INVENTOR(S) : William P. Kornrumph

It is certified that error appears in the above-identified patent and that said Letters Patent is hereby corrected as shown below:

Column 2, line 66, after "strips" insert --,--.

Column 10, line 7, delete "ed" and insert therefore --end--.

Column 8, line 13, delete "410" and insert therefore --410'--.

Column 2, line 7, delete "the" before "residual".

Column 2, line 35, after "in" insert --the--.

Column 3, line 17, after "length" insert --is--.

Column 3, line 26, delete "then" and insert therefore --than--.

Column 3, line 64, after "will" insert --be--.

Signed and Sealed this

Twenty-eighth Day of July, 1992

*Attest:*

DOUGLAS B. COMER

*Attesting Officer*      *Acting Commissioner of Patents and Trademarks*